(12) United States Patent
Cao et al.

(10) Patent No.: US 8,251,132 B2
(45) Date of Patent: Aug. 28, 2012

(54) HEAT SINK ASSEMBLY AND METHOD FOR MANUFACTURING THE SAME

(75) Inventors: Jun Cao, Shenzhen (CN); Shi-Wen Zhou, Shenzhen (CN); Chun-Chi Chen, Taipei Hsien (TW)

(73) Assignees: Fu Zhun Precision Industry (ShenZhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 1189 days.

(21) Appl. No.: 12/056,298

(22) Filed: Mar. 27, 2008

(65) Prior Publication Data

US 2009/0242168 A1    Oct. 1, 2009

(51) Int. Cl.
*F28F 1/32*    (2006.01)
*F28D 15/02*   (2006.01)

(52) U.S. Cl. .................................. 165/80.3; 165/104.21

(58) Field of Classification Search ............... 165/45, 165/47, 48.1, 53, 56, 80.3, 104.21, 104.33; 361/700
See application file for complete search history.

(56) References Cited

U.S. PATENT DOCUMENTS

| | | | |
|---|---|---|---|
| 5,992,511 A * | 11/1999 | Kodaira et al. | 165/80.3 |
| 7,051,792 B2 * | 5/2006 | Lee et al. | 165/104.21 |
| 7,286,352 B2 | 10/2007 | Curtis et al. | |
| 7,650,929 B2 * | 1/2010 | Huang | 165/80.3 |

* cited by examiner

*Primary Examiner* — Teresa Walberg
(74) *Attorney, Agent, or Firm* — Altis Law Group, Inc.

(57) ABSTRACT

A heat sink assembly includes a base, a fin group and a heat pipe connecting with the base and the fin group. The fin group includes a plurality of fins. Each of the fins defines a recess at a lower portion thereof. The heat pipe includes an evaporating portion extending through the base and a condensing portion extending through the fin group. The base is interferentially fitted into the recesses of the fins. The base, the fin group and the heat pipe directly and intimately connect with each other. The recess and the base have correspondingly T-shaped profiles. Each fin forms a bended flange defining the recess. The bended flange intimately contacts with the base and the evaporating portion of the heat pipe.

11 Claims, 3 Drawing Sheets

HEAT SINK ASSEMBLY AND METHOD FOR MANUFACTURING THE SAME

BACKGROUND OF THE INVENTION

1. Field of the Invention

The present invention relates to a heat sink assembly, and more particularly to a heat sink assembly having a plurality of fins, a base and a heat pipe which cooperatively and interferentially engage with each other, and a method for manufacturing the heat sink assembly.

2. Description of Related Art

It is well known that during operation computer electronic devices such as central processing units (CPUs) can generate large amounts of heat. The heat must be quickly removed from the electronic device to prevent it from becoming unstable or being damaged. Typically, a heat sink is attached to an outer surface of the electronic device to absorb heat from the electronic device, and the heat absorbed by the heat sink is then dissipated to ambient air.

A conventional heat sink includes a plate-type base thermally contacting with the CPU, a plurality of fins mounted on a top of the base and a heat pipe sandwiched between the fins and the base. The base defines a groove at a centre thereof. The heat pipe is soldered in the groove of the base. The fins are nickel-plated and soldered on the base. The heat sink assembly must be nickel plated and soldered together, which increases the production cost.

Thus, it is desired to devise a new heat sink assembly which has a low production cost while still can have a high heat dissipation efficiency.

SUMMARY OF THE INVENTION

A heat sink assembly includes a base, a fin group and a heat pipe connecting with the base and the fin group. The fin group includes a plurality of fins. Each of the fins defines a recess at a lower portion thereof. The heat pipe includes an evaporating portion extending through the base and a condensing portion extending through the fin group. The base is interferentially fitted into the recesses of the fins. The base, the fin group and the heat pipe directly and intimately connect with each other. Bended flanges of the fins which define top sides of the recesses intimately engage with the evaporating portion the heat pipe in a groove defined in the base and a top surface of the base. Each recess has a T-shaped configuration.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
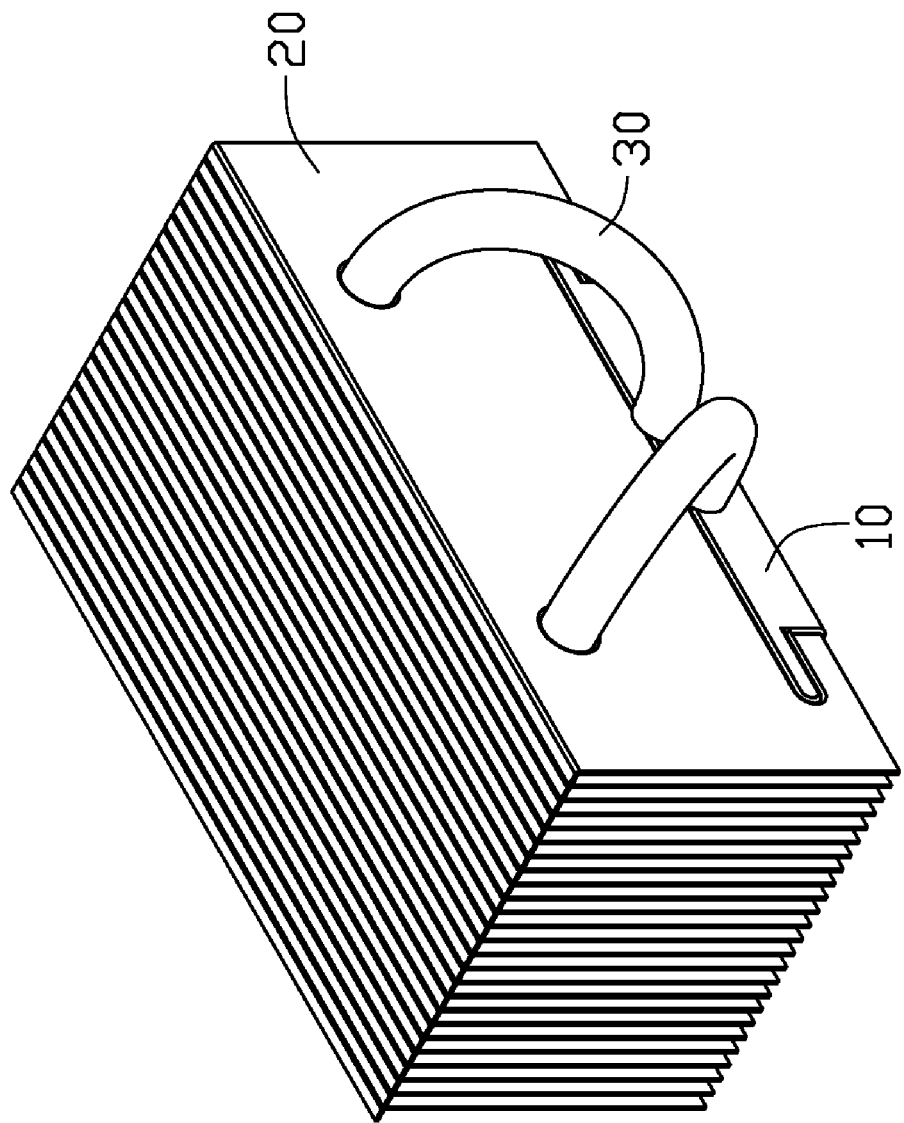
FIG. 1 is an assembled view of a heat sink assembly in accordance with a preferred embodiment of the present invention.

Referring to FIG. 1, a heat sink assembly in accordance with a preferred embodiment of the present invention comprises a base 10 adapted to thermally contact with an electronic component, a fin group 20 coupling with edges of the base 10, and a pair of U-shaped heat pipes 30 interferentially engaging with the base 10 and the fin group 20.

Figure 2:
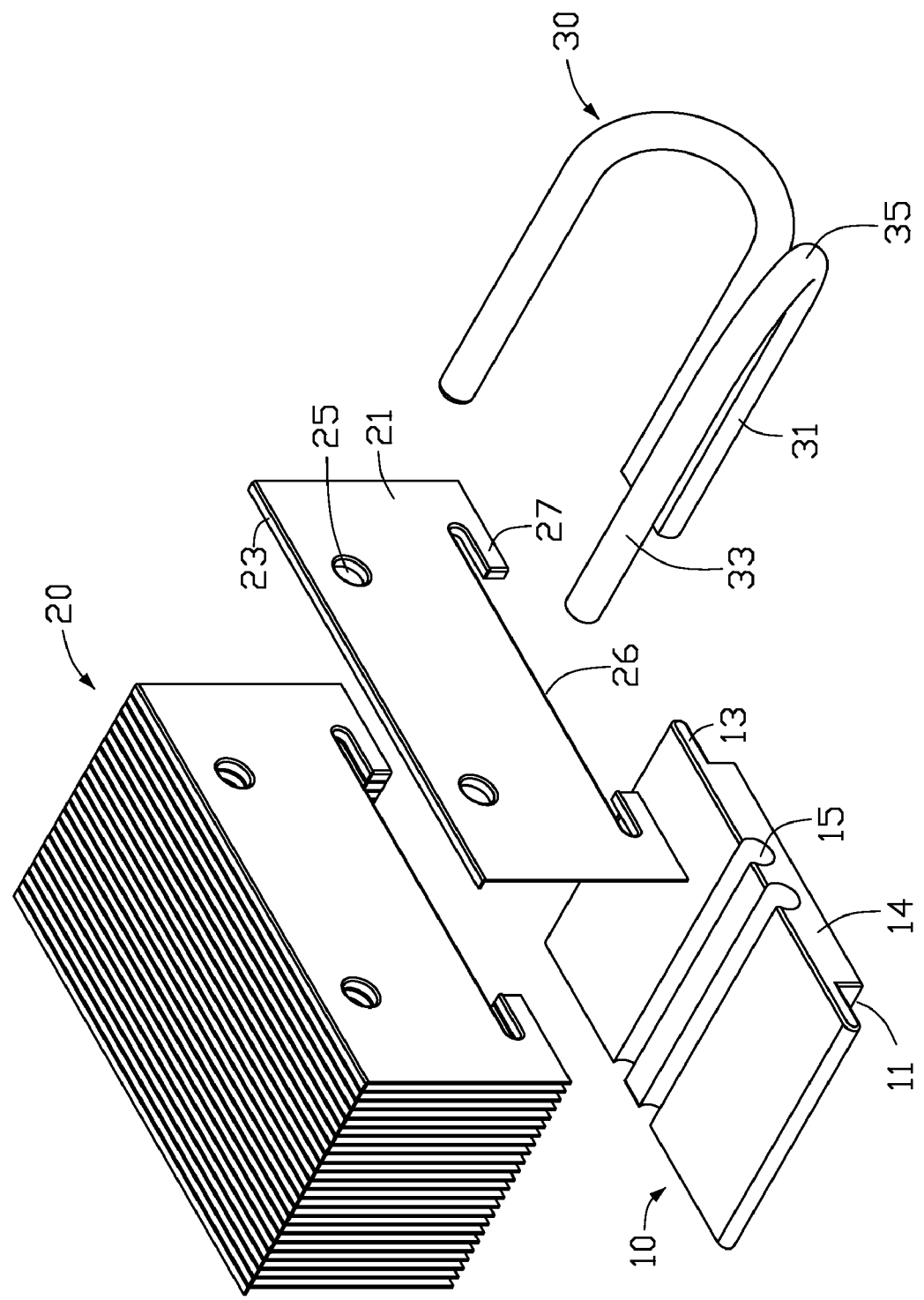
FIG. 2 is an exploded view of FIG. 1.
Figure 3:
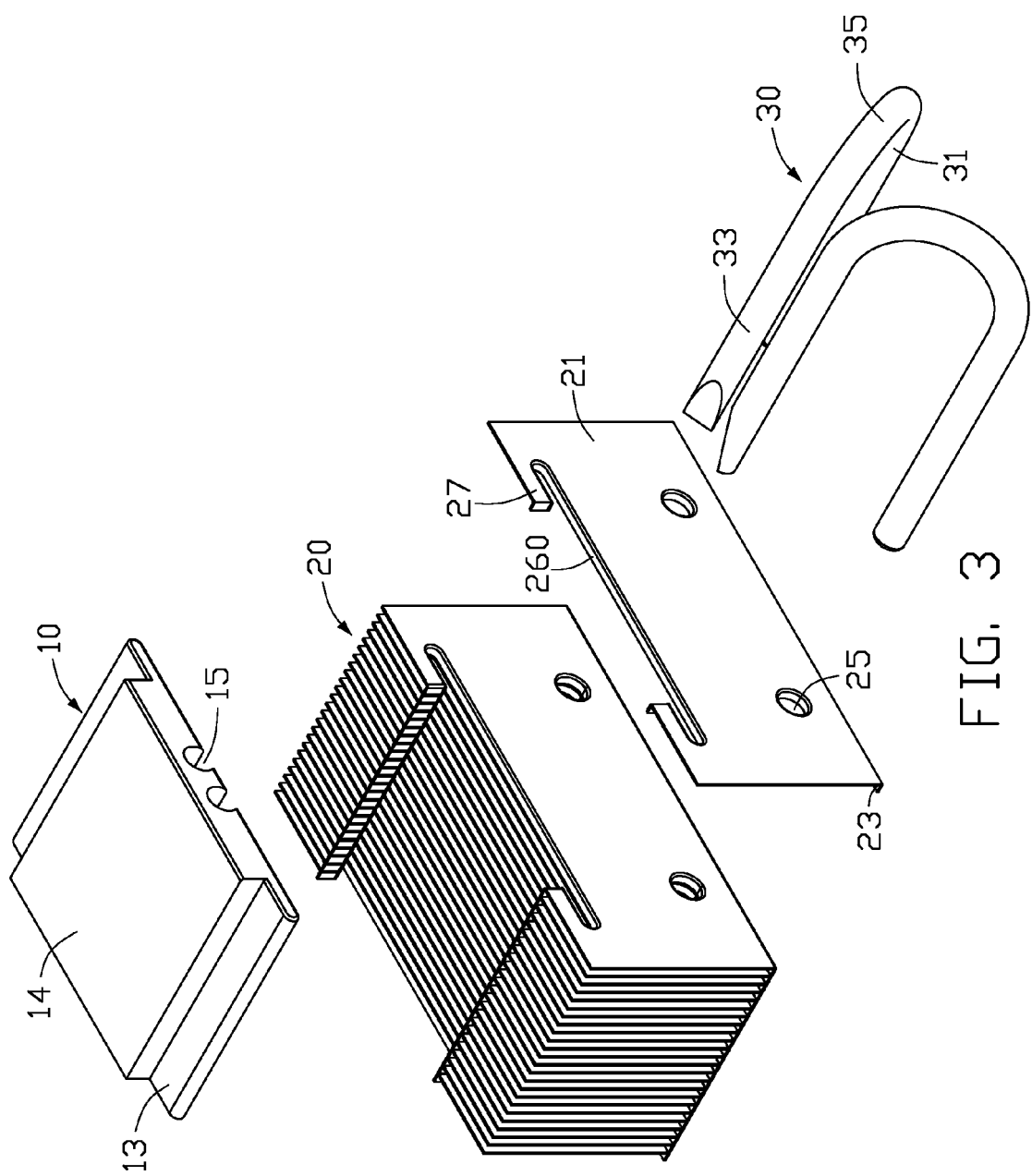
FIG. 3 is an inverted view of FIG. 2.

Referring to FIGS. 2-3 also, each heat pipe 30 comprises an evaporating portion 31, a condensing portion 33 parallel to the evaporating portion 31, and a connecting portion 35 interconnecting with the evaporating portion 31 and the condensing portion 33.

The base 10 is a rectangular, metal plate and has a T-shaped configuration. The base 10 comprises a rectangular heat absorbing portion 14 and a pair of elongated extending portions 13 extending outwardly and horizontally along opposite directions from a top of the heat absorbing portion 14 in a manner that the base 10 has a T-shaped cross section. The extending portions 13 interferentially engage with the fin group 20. Opposite sides of the base 10 define a pair of receiving depressions 11. Each receiving depression 11 is defined by a sidewall (not labeled) of the heat absorbing portion 14 and a bottom surface (not labeled) of the extending portion 13. In other words, the receiving depressions 11 are recessed from two opposite lateral sides of a bottom of the base 10, respectively. Two spaced grooves 15 are defined at a centre of a top surface of the heat absorbing portion 14 of the base 10 to receive the evaporating portions 31 of the heat pipes 30. The grooves 15 and the receiving depressions 11 are parallel to each other.

The fin group 20 comprises a plurality of vertical fins 21. The fins 21 are parallel to and spaced from each other and perpendicular to the base 10. Each fin 21 has a rectangular configuration. An elongated flange 23 extends outwardly from a top edge of the fin 21. A pair of circular through holes 25 are defined at an upper portion of the fin 21 to receive the condensing portions 33 of the heat pipes 30. An inner diameter of the through hole 25 is slightly smaller than that of the condensing portion 33 of the heat pipe 30. A T-shaped recess 26 corresponding to the cross section of the base 10 is defined at a lower portion of the fin 21 to receive the base 10. A pair of pressing members 27 are formed at a bottom of the fin 21 and located beside the recess 26. A size of the recess 26 is slightly smaller than that of the base 10 so that the base 10 is interferentially fitted in the recess 26 when the fin group 20 and the base 10 are assembled together. Each pressing member 27 is elongated. The pressing members 27 are oriented towards each other. The pressing members 27 are received in the receiving depressions 11 and press upwardly the bottom surfaces of the extending members 13 of the base 10. A bended flange 260 extends outwardly from an edge of the fin 21 defining the recess 26 along a direction the same as that of the flange 23. The bended flange 260 is provided for thermally contacting with the base 10 and the evaporating portions 31 of the heat pipes 30.

In assembly, the evaporating portions 31 of the heat pipe 30 are interferentially fitted into the grooves 15 of the base 10. Initially, the evaporating portions 31 are cylindrical and a part of them is located at an outside of the grooves 15. Then, the protruded part the evaporating portions 31 is flattened by means of pressing. Thus, the evaporating portions 31 are interferentially fitted in the grooves 15 to intimately engage with the base 10. Thermal interface material such as thermal grease can be used to fill an interface between the base 10 and the evaporating portions 31 of the heat pipes 30 to lessen the thermal resistance therebetween. A top surface (not labeled) of each of the evaporating portions 31 is coplanar with a top surface of the base 10. The connecting portions 35 of the heat pipes 30 extend slantwise and upwardly from the base 10. Then, the base 10 is interferentially fitted into the recesses 26 of the fins 21 and the condensing portions 33 of the heat pipes 30 are interferentially fitted into the through holes 25 of the fins 21. In this state, the pressing members 27 are received in the receiving depressions 11 of the base 10 to press the extending portions 13 upwardly, and a bottom surface of the heat absorbing portion 14 of the base 10 is coplanar with a bottom surface of the fin group 20. The bended flanges 260 formed on the top surfaces of the pressing members 27 intimately engage with the bottom surfaces of the extending members 13 of the base 10. The bended flanges 260 formed on side surfaces of the pressing members 27 intimately engages with the sidewalls of the heat absorbing portion 14 of the base 10. The bended flanges 260 defining top sides of the T-shaped recesses 26 intimately engage with the evaporating portions 31 of the heat pipes 30 and the top surface of the base 10. Likewise, thermal interface material can be used to fill an interface between the bended flanges 260 and the base 10 and the evaporating portions 31 of the heat pipes 30.

In accordance with a preferred embodiment of the present invention, a method for manufacturing the above described heat sink assembly comprises steps: 1) providing the base 10 having two opposite extending portions 13 at two opposite sides thereof and defining the grooves 15 at a top thereof; 2) providing the fin group 20 defining the recesses 26 at a lower portion thereof and the through holes 25 at an upper portion thereof; 3) providing the heat pipes 30 each having the evaporating portion 31 and the condensing portion 33; 4) inserting the evaporating portions 31 of the heat pipes 30 into the grooves 15 of the base 10 in a manner that the evaporating portions 31 are interferentially fitted into the grooves 15; 5) inserting the extending portions 13 of the base 10 into the recesses 26 of the fin group 20 in a manner that the base 10 interferentially engages into the recesses 26; 6) bending the condensing portions 33 of the heat pipes 30 and inserting the condensing portions 33 into the though holes 25 of the fin group 20 in a manner that the condensing portions 33 interferentially engage into the through holes 25 of the fin group 20.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly comprising:
   a base;
   a fin group comprising a plurality of fins and each of the fins defining a recess at a lower portion thereof; and
   a heat pipe comprising an evaporating portion extending through the base and a condensing portion extending through the fin group to connect the base and the fin group;
   wherein the base is interferentially fitted into the recesses of the fins, and the base, the fin group and the heat pipe directly and intimately connect with each other, an edge of each fin defining the recess intimately engaging with the base and the evaporating portion of the heat pipe;
   wherein the base has a T-shaped configuration and comprises a rectangular heat absorbing portion and a pair of extending portions extending outwardly from opposite sides of a top of the heat absorbing portion, the extending portions interferentially engaged in the recesses of the fins of the fin group, each of the extending portions has a top surface intimately engaging with the fins and a bottom surface parallel to the top surface; and
   wherein each of the recesses has a T-shaped configuration, and a pair of pressing members are formed inwardly at a bottom portion of each of the fins and oriented towards each other, the pressing members intimately engaging with opposite sidewalls of the heat absorbing portion and pressing upwardly the bottom surfaces of the extending portions of the base.

2. The heat sink assembly as claimed in claim 1, wherein each of the pressing members is elongated.

3. The heat sink assembly as claimed in claim 1, wherein a bended flange extends outwardly from the edge of each fin defining the recess thereof, the bended flange intimately contacting with the base and the evaporating portion of the heat pipe.

4. The heat sink assembly as claimed in claim 1, wherein the evaporating portion of the heat pipe has a flattened top surface coplanar with a top surface of the base.

5. A method for manufacturing a heat sink assembly comprising steps:
   (1) offering a base having a T-shaped profile and having a pair of extending portions at two opposite sides thereof;
   (2) offering a fin group defining a recess having a T-shaped profile at a lower portion thereof, a size of the recess being slightly smaller than that of the base;
   (3) pressing the extending portions of the base into the recess of the fin group in a manner that the base is interferentially fitted into the recess of the fin group.

6. The method as claimed in claim 5, wherein the base comprises a rectangular heat absorbing portion, the extending portions extending horizontally outwardly along opposite directions from a top of the heat absorbing portion, a bottom surface of the heat absorbing portion of the base being coplanar with a bottom surface of the fin group.

7. The method as claimed in claim 5, wherein the base defines a groove at a top thereof, and the fin group define a through hole at an upper portion thereof.

8. The method as claimed in claim 5 further comprising a step of providing a heat pipe after the step of offering the fin group.

9. The method as claimed in claim 8, wherein a first end of the heat pipe is pressed into a groove in the base in a manner that the end of the heat pipe is interferentially engaged into the groove of the base, and a second end of the heat pipe is bended in a manner that the second end is interferentially engaged into the through hole of fin group.

10. The method as claimed in claim 5, wherein a flange extends outwardly from an edge of each fin of the fin group defining the recess, the flange abutting against a peripheral of the base.

11. A heat sink assembly comprising:
    a base having a T-shaped profile and a pair of extending portions extending outwardly from opposite sides thereof, each of the extending portions having a top surface and a bottom surface parallel to the top surface;
    a fin group having a plurality of fins each defining a recess at a bottom thereof, the recess having a T-shaped profile corresponding to that of the base, wherein the base is interferentially fitted in the recess, each of the fins forming a flange surrounding the recess thereof, a pair of pressing members formed inwardly at a bottom portion of each of the fins, the pressing members being oriented towards each other and pressing upwardly the bottom surfaces of the extending portions of the base; and
    a heat pipe having an evaporating portion interferentially fitted in the base and a condensing portion interferentially extending through the fin group, wherein flange intimately contacts with the base and the evaporating portion of the heat pipe.

* * * * *